(12) United States Patent
Kurata

(10) Patent No.: US 9,579,883 B2
(45) Date of Patent: Feb. 28, 2017

(54) SYSTEM FOR DETERMINING SUITABILITY OF PRINTING COMPONENT SET IN SCREEN PRINTING DEVICE AND METHOD FOR DETERMINING SUITABILITY OF SET PRINTING COMPONENT

(71) Applicant: Panasonic Intellectual Property Management Co., Ltd., Osaka (JP)

(72) Inventor: Hiroaki Kurata, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/649,044

(22) PCT Filed: Dec. 2, 2013

(86) PCT No.: PCT/JP2013/007059
§ 371 (c)(1),
(2) Date: Jun. 2, 2015

(87) PCT Pub. No.: WO2014/087630
PCT Pub. Date: Jun. 12, 2014

(65) Prior Publication Data
US 2015/0367628 A1 Dec. 24, 2015

(30) Foreign Application Priority Data

Dec. 3, 2012 (JP) .................................. 2012-264040

(51) Int. Cl.
*B41F 15/34* (2006.01)
*B41F 33/00* (2006.01)
(Continued)

(52) U.S. Cl.
CPC .......... *B41F 33/0081* (2013.01); *B41F 15/08* (2013.01); *B41F 15/34* (2013.01);
(Continued)

(58) Field of Classification Search
CPC .......... B41F 15/00; B41F 15/14; B41F 15/34; B41F 15/36; B41F 15/42; B41F 15/0818;
(Continued)

(56) References Cited

U.S. PATENT DOCUMENTS 5,321,486 A * 6/1994 Nanbu ............... G03G 15/5095
347/139
2002/0170973 A1* 11/2002 Teraura .................. B41J 11/009
235/492

(Continued)

FOREIGN PATENT DOCUMENTS

CN 1796109 A 7/2006
JP 06-210827 A 8/1994
(Continued)

OTHER PUBLICATIONS

Machine Translation of JP Publ. No. 2004-338284 to Abe et al. published on Dec. 2, 2004.*
(Continued)

*Primary Examiner* — Daniel J Colilla
*Assistant Examiner* — Marissa Ferguson Samreth
(74) *Attorney, Agent, or Firm* — Pearne & Gordon LLP

(57) ABSTRACT

A method of determining whether printing components suitable for a type of a substrate are correctly set in a screen printing device that makes a mask provided with a pattern hole abut on the substrate, supplies paste onto the mask, and slides a squeegee to thereby print the paste on the substrate through the pattern hole, includes reading identification marks attached to respective printing components, verifying pieces of component information corresponding to the read identification marks using pieces of component information allocated to the substrate in advance in production data, and informing purport when a printing component having discordant component information is present in the verification.

(Continued)

The printing components include at least a mask, a squeegee, and paste.

2 Claims, 8 Drawing Sheets

(51) Int. Cl.
 *B41F 15/08* (2006.01)
 *B41F 15/44* (2006.01)
 *H05K 3/12* (2006.01)
(52) U.S. Cl.
 CPC ............ *B41F 15/44* (2013.01); *H05K 3/1233* (2013.01); *H05K 2203/163* (2013.01)
(58) Field of Classification Search
 CPC ........ B41F 15/085; B41F 15/08; B41F 15/44; B41F 33/0081; H05K 3/1233; H05K 2203/163
 USPC .......................................... 101/13, 126, 129
 See application file for complete search history.

(56) References Cited

U.S. PATENT DOCUMENTS

2006/0124003 A1   6/2006  Sakaida et al.
2009/0273663 A1*  11/2009 Yoshida ............... H04N 9/8047
                                                 348/43
2010/0126363 A1*  5/2010  Mizuno ................ H05K 3/1216
                                                 101/126
2010/0252984 A1*  10/2010 Maeda ................. G03G 15/655
                                                 270/58.23

FOREIGN PATENT DOCUMENTS

| JP | 06-262749 A | 9/1994 | |
| JP | 11-320823 A | 11/1999 | |
| JP | 2004-230785 A | 8/2004 | |
| JP | 2004-338248 A | 12/2004 | |
| JP | 2007-096153 A | 4/2007 | |
| JP | 2007301829 | * 11/2007 | .............. B41J 29/38 |
| JP | 2011-255512 A | 12/2011 | |

OTHER PUBLICATIONS

Machine Translation of JP Publ. No. 06-262749 to Ishikawa et al. published on Sep. 20, 1994.*
International Search Report for Application No. PCT/JP2013/007059 dated Dec. 24, 2013.
Chinese Search Report dated Feb. 22, 2016 for CN201380062958.7.

* cited by examiner

SYSTEM FOR DETERMINING SUITABILITY OF PRINTING COMPONENT SET IN SCREEN PRINTING DEVICE AND METHOD FOR DETERMINING SUITABILITY OF SET PRINTING COMPONENT

TECHNICAL FIELD

The present invention relates to a system for determining suitability of printing components set in a screen printing device that prints paste such as soldering paste or conductive paste on a substrate by using a squeegee, and a method of determining suitability of set printing components which is used to determine suitability of printing components such as a squeegee and paste in a screen printing device.

BACKGROUND ART

In an electronic component mounting process, screen printing has been used as a method of printing paste such as soldering paste or conductive paste on a substrate. In this method, the paste is printed on the substrate through a pattern hole provided in accordance with an area to be printed, the paste fills the pattern hole through a squeegeeing operation of moving a squeegee in a horizontal direction in a state where a lower end portion of the squeegee is pressed against a mask, and the paste is printed on the substrate which is set on the bottom face of the mask.

In this screen printing, since an appropriate mask and paste are required to be used in accordance with characteristics of a substrate which is a target for printing, it has been verified hitherto whether or not a mask and paste used are suitable for a substrate which is a target for printing, at the time of performing printing (for example, see PTL 1 and PTL 2). In the prior art disclosed in PTL 1, the use of a mask suitable for a substrate is guaranteed by reading and verifying bar codes provided in the substrate and the mask. In addition, in the prior art disclosed in PTL 2, printing conditions are set by writing characteristic data of past in a container accommodating the past using a bar code or the like and by reading the characteristic data during production.

CITATION LIST

Patent Literature

[PTL 1] JP-A-6-262749
[PTL 2] JP-A-11-320823

SUMMARY OF INVENTION

Technical Problem

Incidentally, printing conditions have recently diversified at the time of printing paste on a substrate through squeegeeing in accordance with the type of the substrate on which an electronic component is mounted, that is, a material, a thickness, the fineness of a printing pitch, and the like. For this reason, it is necessary to use a squeegee properly in accordance with combination with a target substrate and a mask at the time of performing printing, and thus many types of squeegees having different materials and shapes are prepared. However, in the related arts including the prior arts disclosed in the above-mentioned examples of the patent literature, the substrate and the mask are subjected to verification and confirmation, but are not subjected to verification and confirmation with regard to whether or not the mounted squeegee is suitable for combination with the substrate and the mask. For this reason, when a substrate having a high degree of printing difficulty is used as a target, appropriate printing conditions are not necessarily guaranteed, and thus printing quality may be sometimes degraded.

Consequently, an object of the invention is to provide a system and method for determining suitability of printing components in a screen printing device which are capable of always securing an appropriate combination of printing components used and guaranteeing printing conditions.

Solution to Problem

According to an aspect of the invention, there is provided a system for determining suitability of printing components set in a screen printing device that makes a mask provided with a pattern hole abut on a substrate, supplies paste onto the mask, and slides a squeegee to thereby print the paste on the substrate through the pattern hole. The system includes a suitability determination unit that determines whether or not printing components suitable for a type of the substrate are correctly set in the screen printing device, by verifying pieces of component information read from identification marks attached to the respective printing components using pieces of component information allocated to the substrate in advance in production data. The suitability determination unit includes a printing component identification mark reading unit which reads the identification marks attached to the respective printing components by an operator's operation, a printing component verification unit that verifies the pieces of component information corresponding to the read identification marks using the pieces of component information allocated to the substrate, and an informing unit that informs purport when a printing component having discordant component information is present in a verification result obtained by the printing component verification unit. The printing components include at least a mask, a squeegee, and paste.

According to another aspect of the invention, there is provided a method of determining suitability of printing components set in a screen printing device, the method determining whether or not printing components suitable for a type of a substrate are correctly set in the screen printing device by verifying pieces of component information read from identification marks attached to the respective printing components using pieces of component information allocated to the substrate in advance in production data, the screen printing device making a mask provided with a pattern hole abut on the substrate, supplying paste onto the mask, and sliding a squeegee to thereby print the paste on the substrate through the pattern hole. The method includes a printing component identification mark reading process of reading the identification marks attached to the respective printing components by an operator's operation; a printing component verification process of verifying the pieces of component information corresponding to the read identification marks using the pieces of component information allocated to the substrate; and a informing process of informing purport when a printing component having discordant component information is present in a verification result obtained in the printing component verification process. The printing components include at least a mask, a squeegee, and paste.

Advantageous Effects of Invention

According to the invention, in determining suitability of printing components set in a screen printing device, identification marks attached to the respective printing components including at least a mask, a squeegee, and paste are read by an operator's operation, pieces of component information corresponding to the read identification marks are verified using pieces of component information allocated to a substrate, and the purport is informed when a printing component having discordant component information is present in a verification result, and thus it is possible to reduce the frequency of occurrence of mistake of a printing component due to an artificial error and to guarantee printing conditions by always securing an appropriate combination of printing components used.

DESCRIPTION OF EMBODIMENTS

Figure 1:
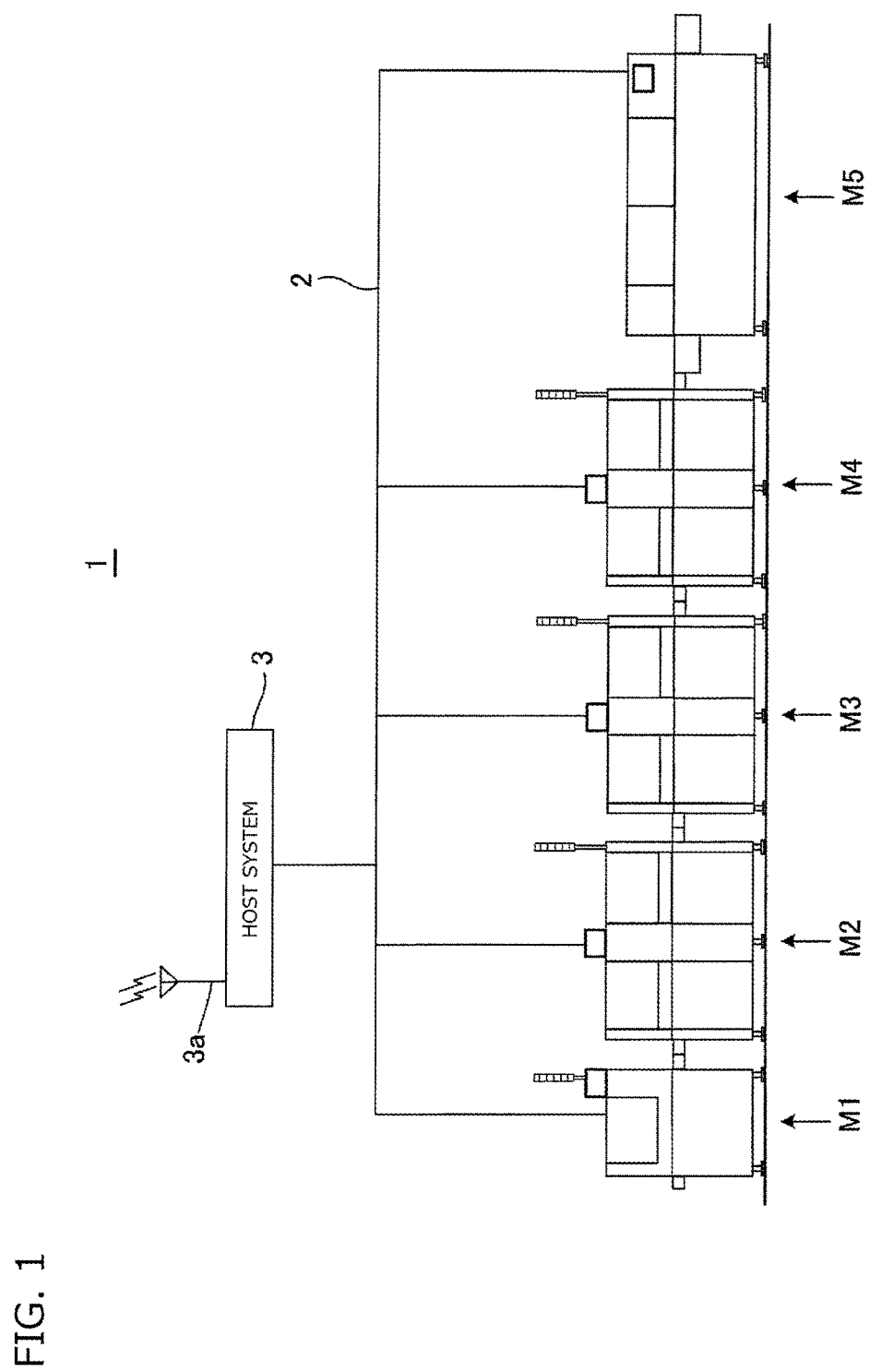
FIG. 1 is a diagram illustrating configuration of a component mounting system according to an embodiment of the invention.

Next, an embodiment of the invention will be described with reference to the accompanying drawings. First, an electronic component mounting system will be described with reference to FIG. 1. In FIG. 1, an electronic component mounting system 1, having a function of manufacturing a mounting substrate by mounting an electronic component on a substrate, is configured such that an electronic component mounting line is constituted by a screen printing device M1, electronic component mounting devices M2 to M4, and a reflowing device M5 connected to each other through a communication network 2 and that all of the devices are controlled by a host system 3. In addition, the host system 3 includes a wireless reception device 3a that receives an input signal which is wirelessly transmitted from a portable terminal device such as a bar code reader.

The screen printing device M1 performs screen printing of pasty solder on an electronic component bonding electrode formed on the substrate. The electronic component mounting devices M2 to M4 pick up an electronic component from a component supply unit by using a mounting head, and transfer and load the electronic component to a mounting position of the substrate on which solder is printed. Thereafter, the substrate on which the electronic component is mounted is transmitted to the reflowing device M5, and the electronic component mounted on the substrate is soldered onto the substrate, thereby completing the manufacture of a mounting substrate.

Figure 2:
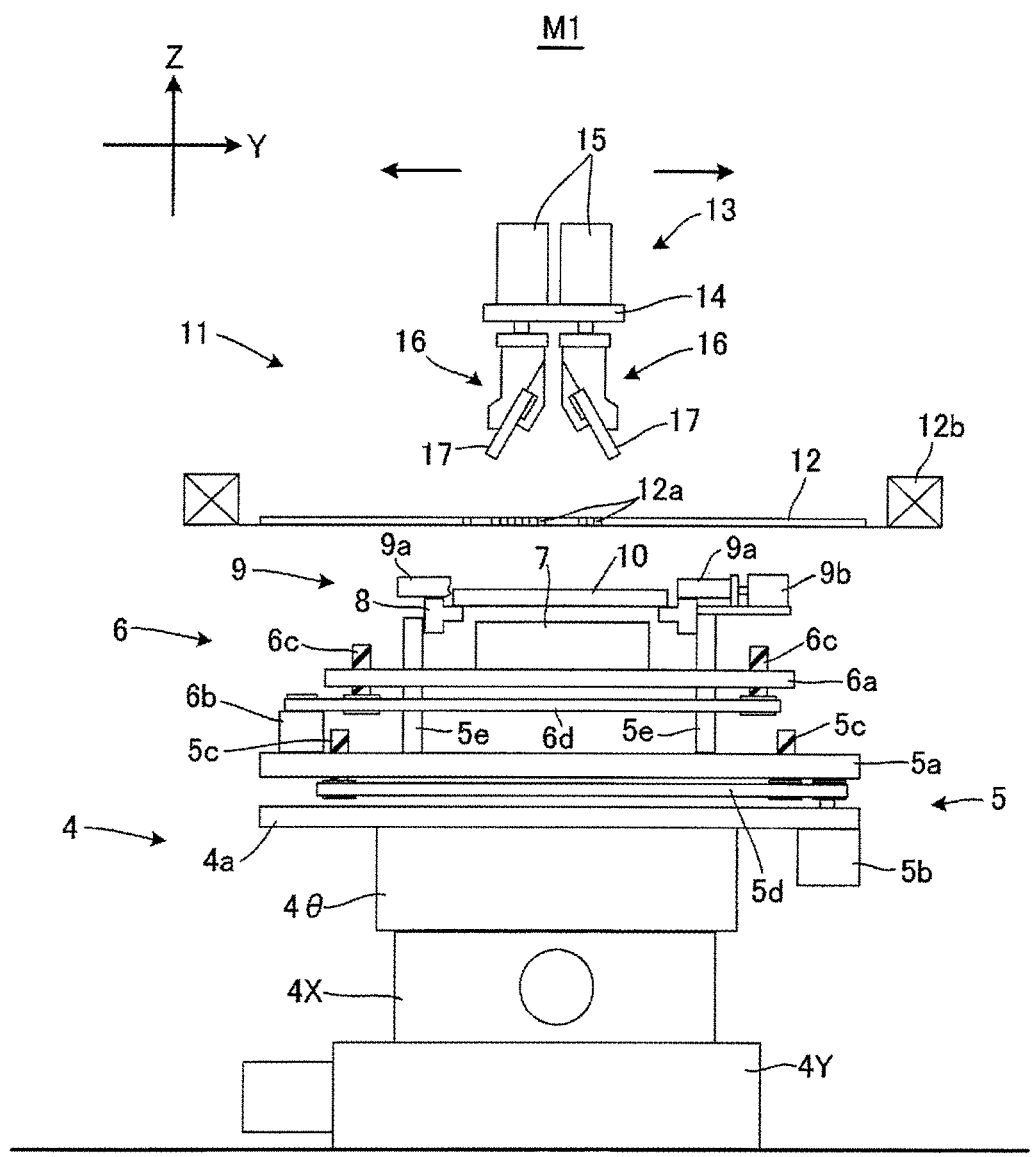
FIG. 2 is a side view of a screen printing device constituting the component mounting system according to the embodiment of the invention.
Figure 3A:
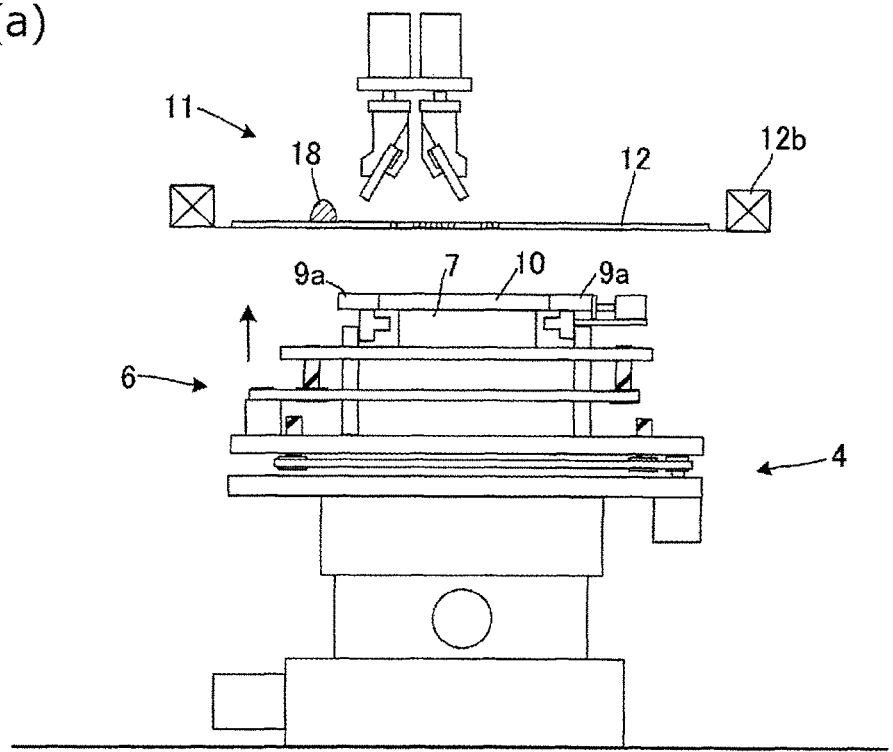
FIGS. 3(a) and 3(b) are diagrams illustrating operation of the screen printing device according to the embodiment of the invention.

Next, the manufacture and operation of the screen printing device M1 will be described with reference to FIG. 2 and FIGS. 3(a) and 3(b). In FIG. 2, the screenprinting device M1 is configured by disposing a screen printing mechanism 11 above a substrate positioning unit 4. The substrate positioning unit 4 is configured by stacking a Y-axis table 4Y, an X-axis table 4X, and a θ-axis table 4θ and further combining a first Z-axis table 5 and a second Z-axis table 6 thereon.

The configuration of the first Z-axis table 5 will be described below. A horizontal base plate 5a is similarly held by a lifting guide mechanism (not shown) so as to be liftable on the upper side of a horizontal base plate 4a provided on the θ-axis table 4θ. The base plate 5a is lifted by a Z-axis lifting mechanism which is configured to rotate a plurality of feed screws Sc through a belt 5d by using a motor 5b.

A vertical frame 5e stands on the base plate 5a, and a substrate conveying mechanism 8 is held at the upper end portion of the vertical frame 5e. The substrate conveying mechanism 8 includes two conveying rails disposed in parallel in a substrate conveying direction (X-direction, vertical direction of the paper in FIG. 1), and supports and conveys both end portions of a substrate 10 which is a target for printing by the conveying rails. It is possible to lift up and down the substrate 10 held by the substrate conveying mechanism 8 with respect to the screen printing mechanism 11 together with the substrate conveying mechanism 8, by driving the first Z-axis table 5. The substrate 10 carried in from the upstream side by the substrate conveying mechanism 8 is positioned by the substrate positioning unit 4. Then, the substrate 10 on which printing is performed by the screen printing mechanism 11 is carried out to the downstream side by the substrate conveying mechanism 8.

The configuration of the second Z-axis table 6 will be described below. A horizontal base plate 6a is disposed between the substrate conveying mechanism 8 and the base plate 5a so as to be liftable along a lifting guide mechanism (not shown). The base plate 6a is lifted up and down by a Z-axis lifting mechanism which is configured to rotate a plurality of feed screws 6c through a belt 6d by using a motor 6b. A substrate under supporting unit 7 on which an under supporting surface supporting the substrate 10 is provided is disposed on the base plate 6a.

The substrate under supporting unit 7 is lifted up and down with respect to the substrate 10 held by the substrate conveying mechanism 8 by driving the second Z-axis table 6. Then, the under supporting surface of the substrate under supporting unit 7 abuts on the bottom face of the substrate 10, and thus the substrate under supporting unit 7 supports the substrate 10 from the bottom face side. A clamping mechanism 9 is disposed on the substrate conveying mechanism 8. The clamping mechanism 9 includes two clamping members 9a which are disposed respectively on the right and left sides so as to face each other. One clamping member 9a is retreated by a driving mechanism 9b so that the substrate 10 is clamped from both sides and is fixed.

Next, the screen printing mechanism 11 disposed above the substrate positioning unit 4 will be described. In FIG. 2, a mask 12 is extended in a mask frame 12b, and is provided with pattern holes 12a corresponding to the shape and position of an electrode which is a target for printing in the substrate 10. The mask 12 is configured to be able to be replaced integrally with the mask frame 12b, and is replaced in accordance with the type of the substrate whenever the type of the substrate 10 which is a target for printing is changed.

A squeegee head 13 is disposed on the mask 12 so as to be movable horizontally in a Y-direction by a squeegee moving mechanism (not shown). The squeegee head 13 is configured such that a squeegee lifting mechanism 15 lifting up and down a squeegee unit 16 is disposed on a horizontal plate 14. A plate-shaped squeegee 17 is detachably mounted to the squeegee unit 16, and the squeegee unit 16 is lifted up and down by driving the squeegee lifting mechanism 15. Thereby, the squeegee 17 abuts on the top face of the mask 12.

Next, a printing operation using the screen printing mechanism 11 will be described with reference to FIGS. 3(a) and 3(b). First, a soldering paste 18 is extracted from a paste container 19 (see FIG. 6) and is supplied onto the mask 12. Thereafter, when the substrate 10 is carried into a printing position by the substrate conveying mechanism 8, the second Z-axis table 6 is driven to lift up the substrate under supporting unit 7 and support the bottom face of the substrate 10 as illustrated in FIG. 3(a). In this state, the substrate 10 is pinched by the clamping members 9a and fixed, and the substrate positioning unit 4 is driven to position the substrate 10 with respect to the mask 12.

Figure 3B:
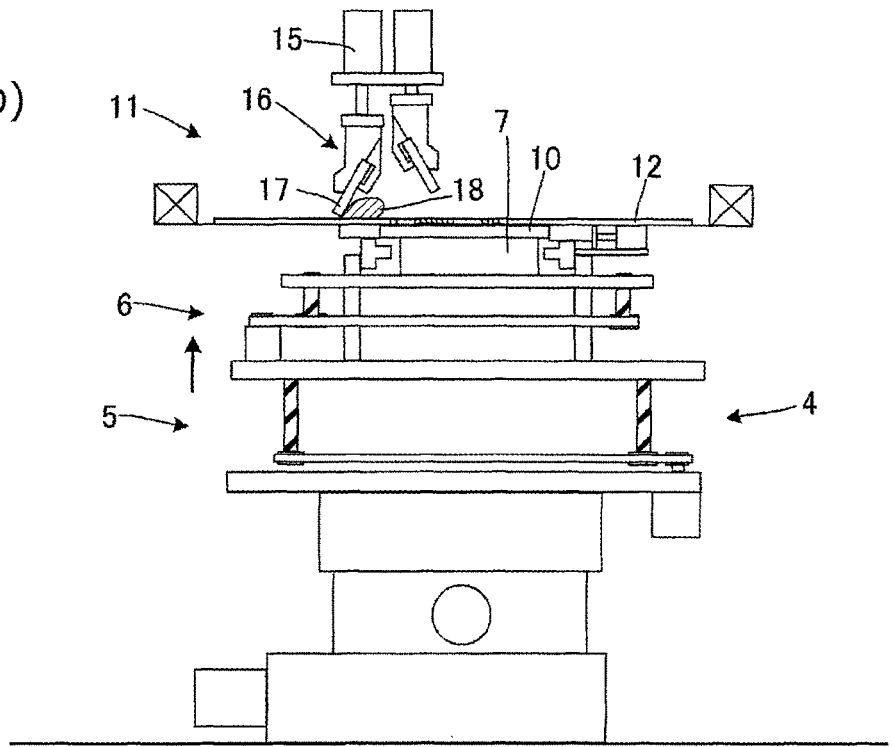

Thereafter, as illustrated in FIG. 3(b), the first Z-axis table 5 is driven so that the substrate 10 is lifted up together with the substrate under supporting unit 7 and abuts on the bottom face of the mask 12. In this state, a squeegeeing operation of sliding the squeegee unit 16 on the mask 12 supplied with the soldering paste 18 is performed so that the soldering paste 18 is swept by the squeegee 17. Thereby, the soldering paste 18 is printed on the substrate 10 through a pattern hole 12a.

Figure 4A:
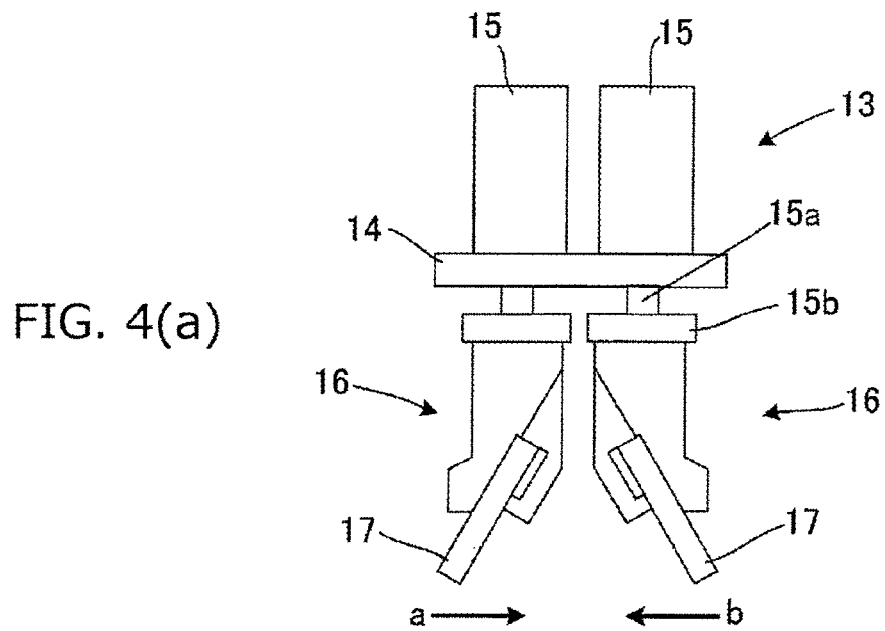
FIGS. 4(a) and 4(b) are diagrams illustrating a configuration of a squeegee unit of the screen printing device according to the embodiment of the invention.

Next, the structure of the squeegee unit 16 mounted to the squeegee head 13 and types of the squeegee 17 will be described with reference to FIGS. 4(a) and 4(b) and FIGS. 5(a) to 5(c). In FIG. 4(a), the squeegee lifting mechanism 15 disposed on the plate 14 includes a lifting axis 15a extending downward from the lower portion of the squeegee lifting mechanism, and a mounting unit 15b is coupled to the lower end portion of the lifting axis 15a. The squeegee unit 16 holding the squeegee 17 is mounted to the mounting unit 15b.

The pair of squeegee units 16 having the same configuration are mounted to the squeegee head 13 so as to face each other, and a screen printing operation is performed by lifting down any one squeegee unit 16 in a squeegeeing operation direction in the mask 12. That is, the squeegeeing operation is performed by lifting down the squeegee unit 16 on the left side when the squeegeeing operation is performed in the direction of an arrow a, and by lifting down the squeegee unit 16 on the right side when the squeegeeing operation is performed in the direction of an arrow b.

Figure 4B:
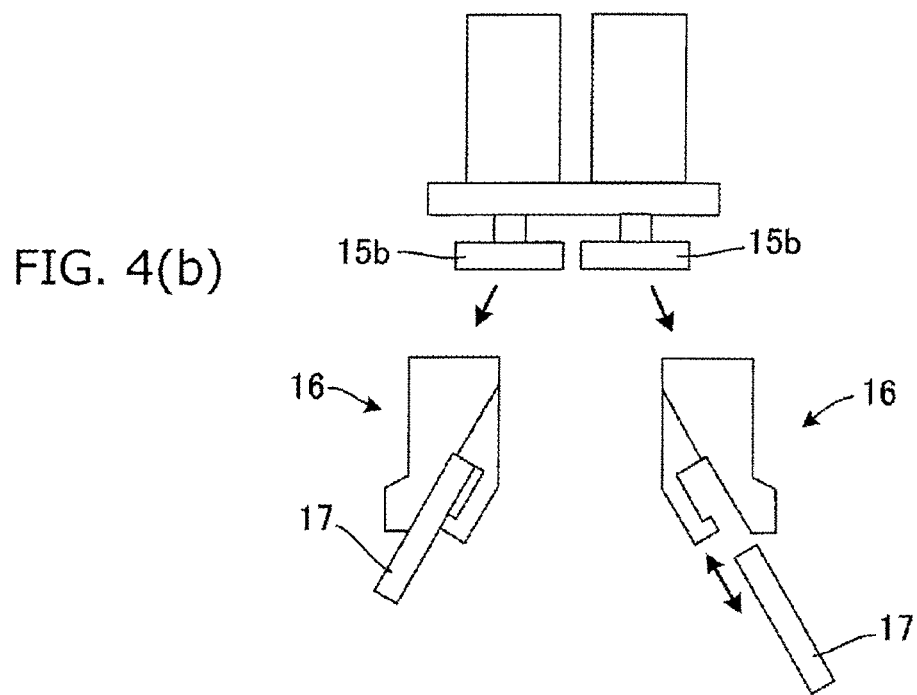

Incidentally, printing conditions have recently diversified at the time of printing paste on a substrate through squeegeeing in accordance with the type of a substrate on which an electronic component is mounted, that is, a material, a thickness, the fineness of a printing pitch, and the like. For this reason, it is necessary to replace the squeegee 17 mounted to the squeegee head 13 with a squeegee suitable for the printing conditions so that various types of substrates can be subjected to printing in the same screen printing device. The screen printing device M1 of the present embodiment is configured such that only the squeegee 17 can be replaced in the squeegee unit 16 coupled to the mounting unit 15b, as illustrated in FIG. 4(b).

Figure 5A:
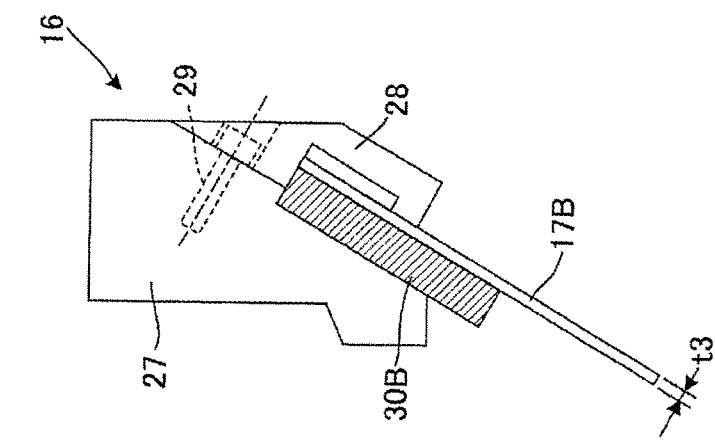
FIGS. 5(a) to 5(c) are diagrams illustrating configurations of squeegees which are used in the screen printing device according to the embodiment of the invention.
Figure 5B:
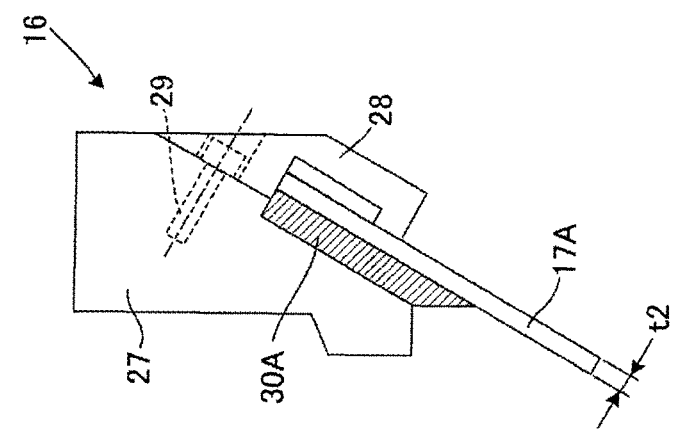
Figure 5C:
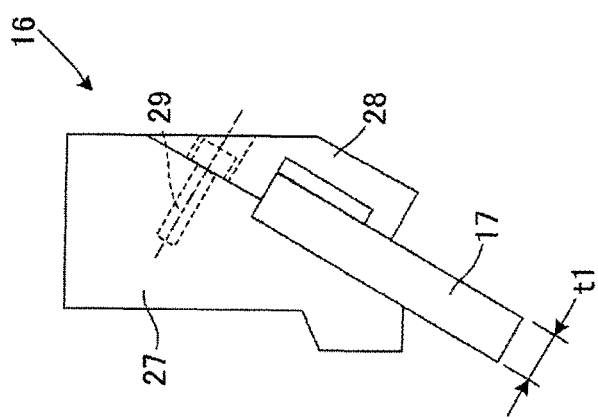

Hereinafter, examples of squeegees to be replaced are illustrated in FIGS. 5(a) to 5(c). FIG. 5(a) illustrates a urethane-rubber-made squeegee 17 having a largest thickness t1. When the squeegee 17 is held by a holder, the squeegee 17 is inserted between a first member 27 and a second member 28 and is fastened by a bolt 29.

FIG. 5(b) illustrates a resin-made squeegee 17A having a thickness t2 smaller than the thickness t1 of the squeegee 17. In this case, since the squeegee 17A cannot be independently held by the holder due to a difference in thickness, the squeegee is similarly fixed by a fastening force of the bolt 29 in a state where a backup member 30A for compensating for the difference in thickness is inserted between the first member 27 and the second member 28 together with the squeegee 17A.

FIG. 5(c) illustrates a metallic squeegee 17B having a thickness t3 smaller than the thickness t2 mentioned above. In this case, similarly, since the squeegee 17B cannot be independently held by the holder, the squeegee is similarly fixed by a fastening force of the bolt 29 in a state where a backup member 30B compensating for a difference in thickness is inserted between the first member 27 and the second member 28 together with the squeegee 17B.

The squeegee unit 16 is configured as described above, and thus it is not necessary to prepare a dedicated holder for each type of squeegee and to share a single holder, which allows a reduction in a facility cost to be achieved. In addition, whenever a squeegee is replaced, only a single squeegee may be taken out and replaced without removing the entire squeegee unit 16, and thus reductions in time and labor for squeegee replacement are realized.

Figure 6:
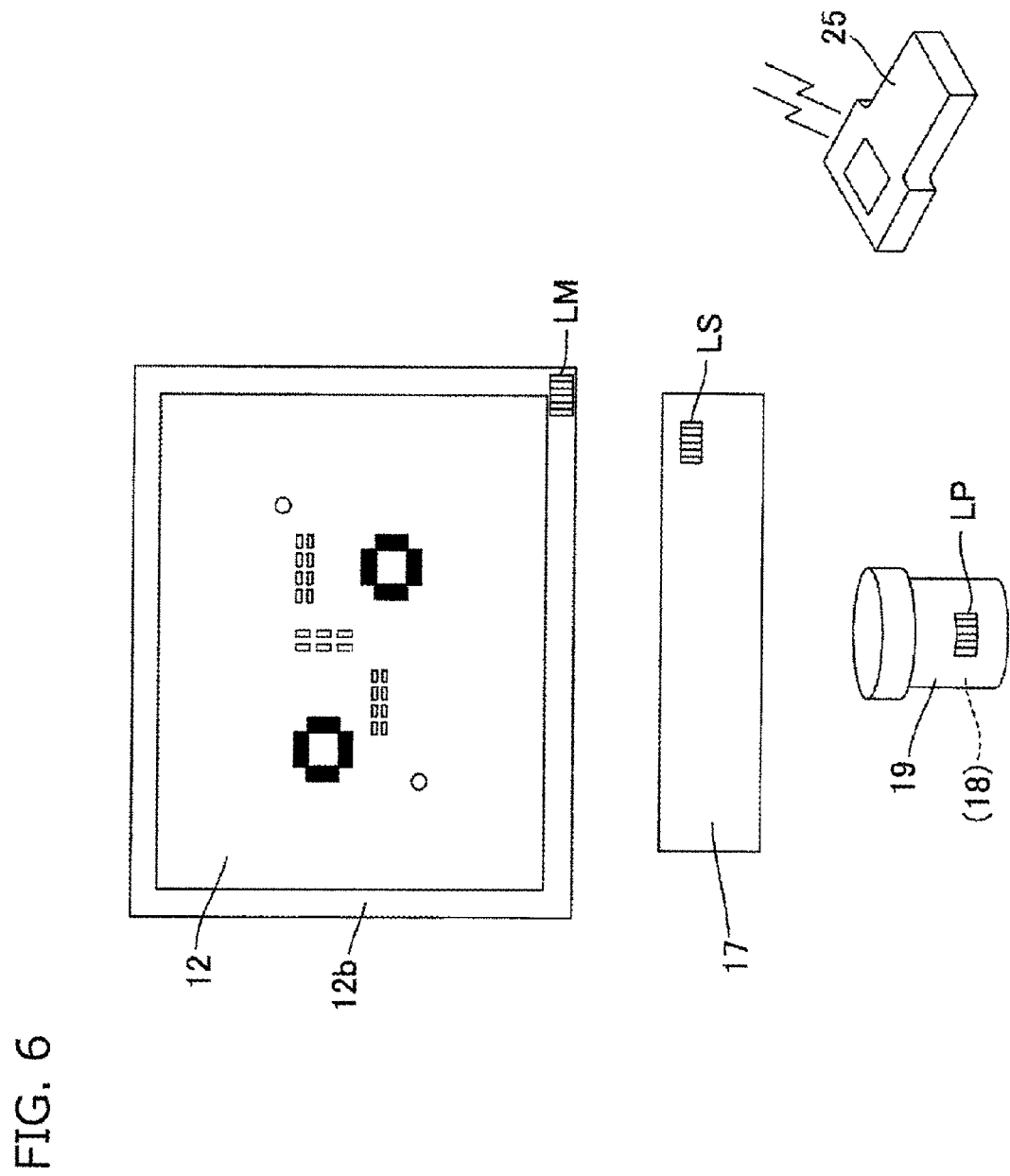
FIG. 6 is a diagram illustrating a method of identifying printing components used in the screen printing device according to the embodiment of the invention.

Next, reference will be made to FIG. 6 to describe the reading of an identification mark which is performed whenever a production model indicating the type of a substrate which is a target for printing is changed at the time of performing a printing operation in the screen printing device M1. In the screen printing performed in the electronic component mounting system 1 illustrated in the present embodiment, the mask 12, the squeegee 17, and the soldering paste 18 as printing components are provided with a bar code label type identification mark for the purpose of confirming whether or not the mounted squeegee is suitable for combining with the substrate and the mask, and component information read from the identification marks are verified using production data.

That is, a mask label LM as an identification mark for specifying the mask 12 is attached to the mask frame 12b in which the mask 12 is extended. In addition, a squeegee label LS as an identification mark for specifying the squeegee 17 is attached to the squeegee 17. Further, a paste label LP as an identification mark for specifying the soldering paste 18 accommodated in the paste container 19 is attached to the paste container 19 accommodating the soldering paste 18. An operator reads the mask label LM, the squeegee label LS, and the paste label LP by operating a bar code reader 25, and thus pieces of component information of the mask 12, the squeegee 17, and the soldering paste 18 are identified. Then, an identification result is transmitted to the wireless reception device 3a of the host system 3 from the bar code reader 25 and is verified using production data by a suitability determination function of the host system 3, thereby determining suitability of a combination.

Figure 7:
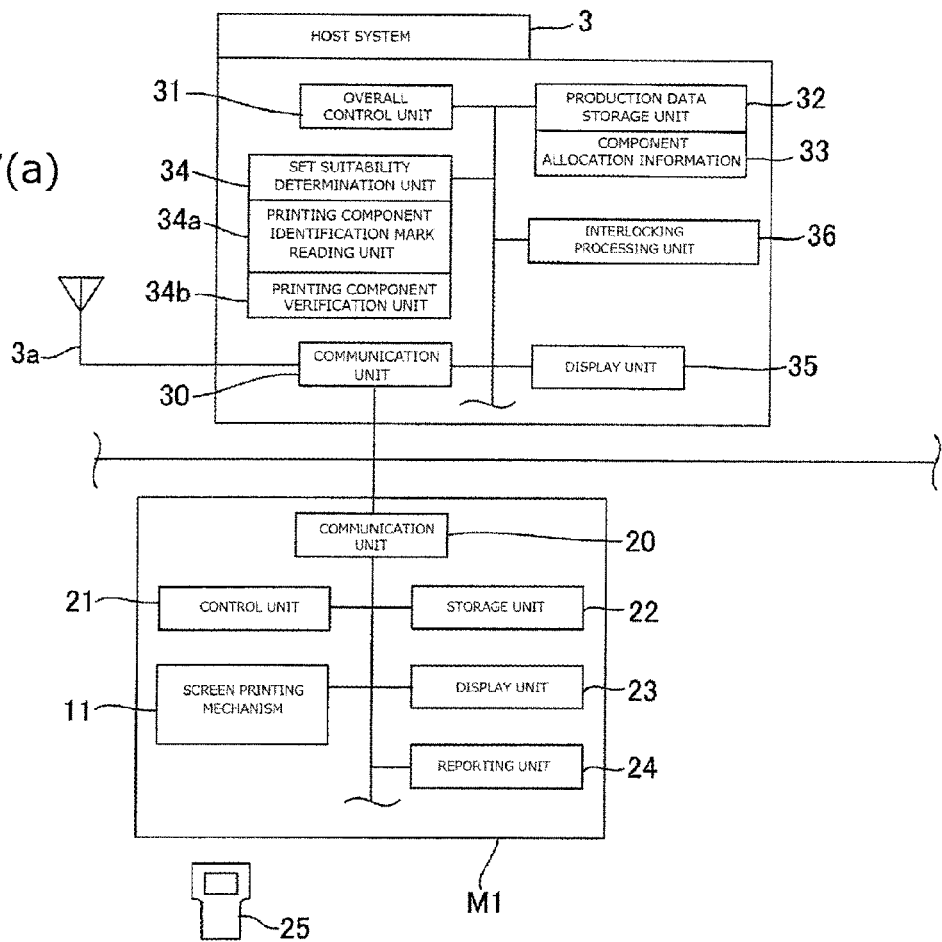
FIGS. 7(a) and 7(b) are block diagrams illustrating a configuration of a control system of a mounting system according to the embodiment of the invention.

Next, the configuration of a control system of the electronic component mounting system 1 will be described with reference to FIGS. 7(a) and 7(b). Here, the drawings illustrate only a configuration for determining suitability with regard to whether printing components suitable for the type of a substrate are correctly set or not, in the screen printing device M1 constituting the electronic component mounting system 1. In FIG. 7(a), the screen printing device M1 includes a communication unit 20, a control unit 21, a storage unit 22, a display unit 23, and an informing unit 24.

The communication unit 20 transmits and receives a signal between the host system 3 constituting the electronic component mounting system 1 and another device through the communication network 2. The control unit 21, which is a processing computation device, controls each unit of the device such as the screen printing mechanism 11 on the basis of a program and data stored in the storage unit 22. The display unit 23 performs data processing for displaying various types of screens on a display panel. The informing unit 24 informs predetermined contents using display means such as an indicating lamp or a display panel on the basis of a signal transmitted through the control unit 21 or the communication unit 20.

The host system 3 includes a communication unit 30, an overall control unit 31, a production data storage unit 32, a set suitability determination unit 34, a locking processing unit 36, and a display unit 35. The communication unit 30 transmits and receives a signal to and from another device constituting the electronic component mounting system through the communication network 2, and receives identification information read by the bar code reader 25 on the machine side of the screen printing device M1, through the wireless reception device 3a. The overall control unit 31, which is an overall control device, manages the overall operation of the electronic component mounting system 1 on the basis of various types of programs and data stored in the production data storage unit 32.

The production data storage unit 32 stores data regarding printing conditions for performing a printing operation, and component allocation information 33 for specifying component information of a printing component allocated in response to the type of substrate to be produced. The set suitability determination unit 34 determines whether or not printing components suitable for the type of substrate are correctly set, on the basis of a reading result of an identification mark using the bar code reader 25 and the component allocation information 33. The display unit 35 displays an operation screen and an informing screen for predetermined items.

FIG. 7(b) illustrates the configuration of the component allocation information 33 stored in the production data storage unit 32, and the component allocation information 33 includes a "production model" 33a, a "mask" 33b, a "squeegee" 33c, a "soldering paste" 33d, and a "production number" 33e. The "production model" 33a indicates substrate types A, B, . . . of the substrate 10 which is a target for a printing operation, and component information is set in each of the following times in response to the substrate types.

The "mask" 33b indicates pieces of component information Ma, Mb, . . . for specifying the mask 12, and corresponds to the mask label LM attached to the mask frame 12b. The "squeegee" 33c indicates pieces of component information Sa, Sb, . . . for specifying the squeegee 17 which is set in the squeegee unit 16, and corresponds to the squeegee label LS attached to the squeegee 17. The "soldering paste" 33d indicates pieces of component information Pa, Pb, . . . for specifying the paste container 19 accommodating the soldering paste 18 used, and corresponds to the paste label LP attached to the paste container 19. The "production number" 33e indicates a production number for each production lot specified in the production data.

The set suitability determination unit 34 determines whether printing components suitable for the type of substrate 10, that is, the mask 12, the squeegee 17, and the soldering paste 18 are correctly set in the screen printing device M1, by collating the component information read from the mask label LM, the squeegee label LS, and the paste label LP respectively attached to the mask 12, the squeegee 17, and the soldering paste 18 with component information allocated to the substrate in advance in the component allocation information 33 of production data, by using functions of a printing component identification mark reading unit 34a and a printing component verification unit 34b. The locking processing unit 36 performs a process of locking the screen printing device Ml when a printing component having discordant component information is present in a verification result obtained by the printing component verification unit 34b. Thereby, it is possible to reliably prevent a printing component from being mistaken due to an artificial error.

In the above-mentioned configuration, the set suitability determination unit 34 of the host system 3, the production data storage unit 32 storing the component allocation information 33, the informing unit 24 provided in the screen printing device M1, and the display means constitute a suitability determination system that determines the suitability of printing components in the screen printing device M1.

Figure 8:
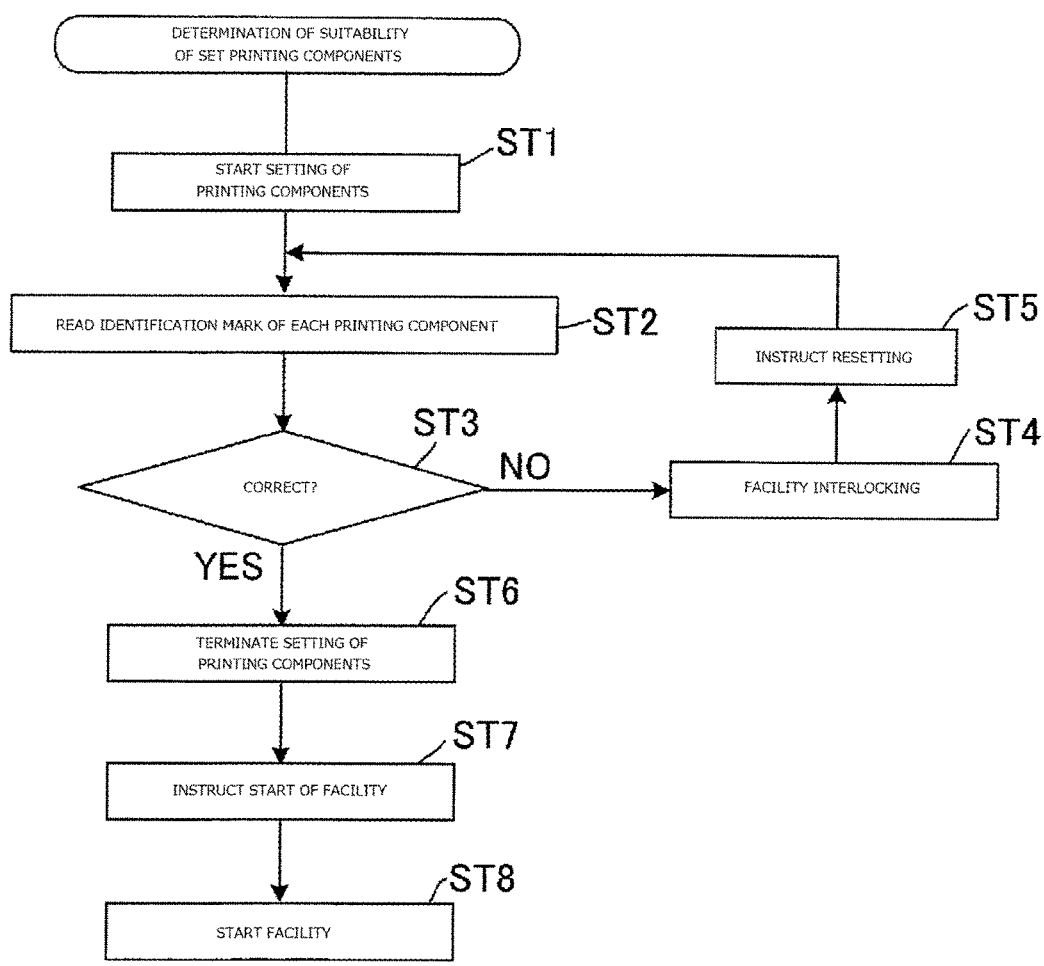
FIG. 8 is a flow chart illustrating a method of determining suitability of set printing components of the screen printing device according to the embodiment of the invention.

A process of determining the suitability of printing components will be described below with reference to a flow of FIG. 8. First, the setting of printing components is started (ST1). An operator accesses to the screen printing mechanism 11, sets the mask 12 and the squeegee 17 which are suitable for a production model designated in production data, and supplies the designated soldering paste 18 onto the mask 12.

Subsequently, an identification mark of each printing component is read (ST2). That is, an operator reads the mask label LM, the squeegee label LS, and the paste label LP which are respectively attached to the mask 12, the squeegee 17, and the paste container 19 used to supply the soldering paste 18 by using the bar code reader 25 to thereby wirelessly transmit a reading result to the host system 3.

In the host system 3, the suitability of the mask 12, the squeegee 17, and the soldering paste 18 is determined by verifying pieces of read component information corresponding to the mask label LM, the squeegee label LS, and the paste label LP using component information allocated to the substrate 10 in the component allocation information 33 (ST3). Here, in a case of incorrectness, facility locking is first automatically performed for safety (ST4). Thereafter, an instruction to the effect that the corresponding printing component is to be reset is informed by display means such as an indicating lamp or a display panel of the screen printing device M1 (ST5). An operator performs a necessary resetting operation in response to the instruction and then repeats the process of (ST2) and the subsequent processes.

Then, in a case of correctness in (ST3), the setting of the printing components is terminated (ST6). Subsequently, the start of facility is instructed (ST7), and a facility operation is started in order to start a printing operation to be performed on the substrate 10 (ST8). In this printing operation, a combination of the mask 12, the squeegee 17, and the soldering paste 18 which are suitable for the printing condition to be performed on the substrate 10 is guaranteed, and thus it is possible to secure printing quality even when the substrate 10 having a high degree of printing difficulty is used as a production target.

In the above-mentioned processing, first, the processing in (ST2) corresponds to a printing component identification mark reading process and is performed by the printing component identification mark reading unit 34a. That is, the printing component identification mark reading unit 34a performs a process for reading the mask label LM, the squeegee label LS, and the paste label LP which are identification marks respectively attached to the mask 12, the squeegee 17, and the paste container 19 for the soldering paste 18 by an operator's operation. In the present embodiment, a configuration is adopted in which printing components to be identified include at least the mask 12, the squeegee 17, and the soldering paste 18. Thereby, it is possible to appropriately secure the use management of the printing components, inclusive of the squeegee 17 required to be properly used in accordance with printing conditions.

The process in (ST3) corresponds to a printing component verification process and is performed by the printing component verification unit 34b. That is, the printing component verification unit 34b performs a process of collating pieces of component information corresponding to the mask label LM, the squeegee label LS, and the paste label LP which are read with component information allocated to the substrate 10 in the component allocation information 33.

When it is determined in (ST3) that a verification result is not correct, the process of instructing resetting in (ST5) corresponds to an informing process and is performed by displaying the instruction of resetting on display means such as an indicating lamp or a display panel of the screen printing device M1 by using the informing unit 24, on the basis of a determination result transmitted from the set suitability determination unit 34. Accordingly, the informing unit 24 and the display means function as informing units that inform the purport when a printing component having discordant component information is present in the verification result obtained by the printing component verification unit 34b. In addition, (ST4) corresponds to a locking process of locking the screen printing device M1 when a printing component having discordant component information is present in the verification result in the printing component verification process.

As described above, in the printing component suitability determination in the screen printing device according to the present embodiment, identification marks respectively attached to printing components including at least the mask 12, the squeegee 17, and the soldering paste 18 are read by an operator's operation, pieces of component information corresponding to the read identification marks are verified using component information allocated to a substrate in production data, and the purport is informed when a printing component having discordant component information is present in a verification result. Thereby, it is possible to reduce the frequency of occurrence of mistakes of a printing component due to an artificial error and to guarantee printing conditions by always securing an appropriate combination of printing components used.

Meanwhile, the above-mentioned embodiment describes a configuration example in which a processing function of the set suitability determination unit 34 is performed by the host system 3 in the electronic component mounting system 1, but the invention is not limited to this configuration. A device such as the screen printing device M1 which constitutes the electronic component mounting system 1 may be given a processing function of the set suitability determination unit 34. In addition, in the present embodiment, display means included in the screen printing device M1 is used as an informing unit that informs discordance between an input setting position and a read identification mark, but the function of the display unit 35 of the host system 3 may be used as the informing unit.

Although the present invention has been described so far in detail with reference to a specific embodiment, it will be obvious to those skilled in the art that various changes and modifications may be made without departing from the spirit and the scope of the invention.

This application is based on a Japanese patent application filed on Dec. 3, 2012 (Japanese Patent Application No. 2012-264040), the entire contents thereof being thereby incorporated by reference.

Industrial Applicability

A system and method for determining the suitability of printing components in a screen printing device of the invention have an effect of allowing printing conditions to be guaranteed by always securing an appropriate combination of printing components used, and are useful in printing cream solder or paste such as conductive paste on a substrate by using a squeegee.

Reference Signs List

1 Electronic component mounting system
2 Communication network
4 Substrate positioning unit
10 Substrate
11 Screen printing mechanism
12 Mask
12a Pattern hole
12b Mask frame
13 Squeegee head
16 Squeegee unit
17, 17A, 17B Squeegee
18 Soldering paste
19 Paste container
25 Bar code reader
LM Mask label
LS Squeegee label
LP Paste label
M1 Screen printing device

The invention claimed is:

1. A system for determining suitability of printing components set in a screen printing device that makes a mask provided with a pattern hole abut on a substrate, supplies paste onto the mask, and slides a squeegee to thereby print the paste on the substrate through the pattern hole, the system comprising:

a suitability determination unit that determines whether or not printing components suitable for a type of the substrate are correctly set in the screen printing device, by verifying pieces of component information read from identification marks attached to the respective printing components using pieces of component information allocated to the substrate in advance in production data, wherein the suitability determination unit includes
a printing component identification mark reading unit that reads the identification marks attached to the respective printing components,
a printing component verification unit that verifies the pieces of component information corresponding to the read identification marks using the pieces of component information allocated to the substrate, and
an informing unit that displays when a printing component having discordant component information is present in a verification result obtained by the printing component verification unit, and the printing components include at least a mask, a squeegee, and paste, wherein the system further comprises a control unit that locks the screen printing device when the printing component having discordant component information is present in the verification result obtained by the printing component verification unit, wherein the control unit is connected to the printing component verification unit.

2. A method of determining whether printing components suitable for a type of a substrate are correctly set in a screen printing device that makes a mask provided with a pattern hole abut on the substrate, supplies paste onto the mask, and slides a squeegee to thereby print the paste on the substrate through the pattern hole, the method comprising:

reading identification marks attached to respective printing components;

verifying pieces of component information corresponding to the read identification marks using pieces of component information allocated to the substrate in advance in production data;

informing process of displaying when a printing component having discordant component information is present in the verification; and locking the screen printing device when the printing component having discordant component information is present in the verification, wherein the printing components include at least a mask, a squeegee, and paste.

* * * * *